United States Patent [19]

Mooradian

[11] Patent Number: 5,289,485
[45] Date of Patent: Feb. 22, 1994

[54] MULTI-ELEMENT OPTICALLY PUMPED EXTERNAL CAVITY LASER SYSTEM

[75] Inventor: Aram Mooradian, Winchester, Mass.

[73] Assignee: Micracor, Inc., Acton, Mass.

[21] Appl. No.: 995,072

[22] Filed: Dec. 22, 1992

Related U.S. Application Data

[63] Continuation-in-part of Ser. No. 757,182, Sep. 10, 1991, Pat. No. 5,172,390.

[30] Foreign Application Priority Data

Sep. 9, 1992 [WO] World Int. Prop. O. ......... 92/07557

[51] Int. Cl.$^5$ ............................................... H01S 3/19
[52] U.S. Cl. ............................................ 372/45; 372/50
[58] Field of Search .................... 372/20, 22, 23, 45, 372/46, 50, 71, 96

[56] References Cited

U.S. PATENT DOCUMENTS

| | | | |
|---|---|---|---|
| 4,856,871 | 8/1989 | Van Sant | 350/253 |
| 4,890,289 | 12/1989 | Basu et al. | 372/33 |
| 5,141,319 | 8/1992 | Kajimura et al. | 372/43 |
| 5,231,642 | 7/1993 | Scifres et al. | 372/20 |

FOREIGN PATENT DOCUMENTS

| | | |
|---|---|---|
| 56-42389 | 4/1981 | Japan . |
| 58-114338 | 7/1983 | Japan . |
| 61-264777 | 11/1986 | Japan . |
| 63-029330 | 8/1988 | Japan . |

OTHER PUBLICATIONS

Jewell et al., "Microlasers", *Scientific American*, pp. 86-94, (1991).
Goodhue, "Using Molecular-Beam Epitaxy to Fabricate Quantum-Well Devices", *The Lincoln Laboratory Journal*, 2(2):183-206 (1989).
Eglash et al., "Efficient GaInAsSb/AlGaAsSb Diode Lasers Emitting at 2.29 $\mu$m", *Appl. Phys. Lett.*, 57(13):1292-1294 (1990).
Chiu et al., "Room-Temperature Operation of In-GaAsSb/AlGaSb Double Heterostructure Lasers Near 2.2 $\mu$m Prepared by Molecular Beam Epitaxy", *Appl. Phys. Lett.*, 49(17):1051-1052 (Jan. 1986).
Zyskind et al., "2.2 $\mu$m GaInAsSb/AlGaAsSb Injection Lasers With Low Threshold Current Density", *Appl. Phys. Lett.*, 51(10):764-766 (Jan. 1987).
Bochkarev et al., "Injection Lasers Operating Continuously At Room Temperature at =2.33 m", *Phys. Inst., Acad Sci. of USS* Paper No. 8, (Jan. 1988).
Bochkarev et al., "International Conference on Semiconductor Injection Lasers Selco-87", *Sov. J. Quantum Electron*, 18(11):1362-1363, (Jan. 1988).
Ohmori et al., "Room Temperature CW Operation of GaSb/AlGaSb MQW Laser Diodes Grown by MBE", *Japanese Journal of Applied Physics*, 24(8):L657-L660 (Jan. 1985).
"External-Cavity Semiconductor Laser with 1000 GHz Continuous Piezoelectric Tuning Range", Schremer et al., *IEEE Photonics Letters*, vol. 2, No. 1, Jan. 1990, pp. 3-5.
"Miniature Packaged External-Cavity Semiconductor Laser with 50 GHz Continuous Electrical Tuning Range", Mellis et al., *Electronics Letters*, vol. 24, No. 16, Aug. 4, 1988, pp. 988-989.

*Primary Examiner*—Rodney B. Bovernick
*Assistant Examiner*—Robert E. Wise
*Attorney, Agent, or Firm*—Hamilton, Brook, Smith & Reynolds

[57] ABSTRACT

A series of quantum well laser chips is mounted on a frame disposed in an external cavity opposite a tuning element. Selected chips are optically pumped by a diode laser or diode laser array. The laser light from one of the facets of a selected chip is collimated by a lens onto the tuning element. The tuning element disperses the light and a portion of the dispersed light at the single frequency is coupled back to the facet causing the chip to generate single frequency TEM$_{00}$ radiation.

24 Claims, 3 Drawing Sheets

MULTI-ELEMENT OPTICALLY PUMPED EXTERNAL CAVITY LASER SYSTEM

RELATED APPLICATION

This application is a continuation-in-part of U.S. Ser. No. 07/757,182, filed Sep. 10, 1991 entitled "Pre-Aligned Diode Laser for External Cavity Operation", now U.S. Pat. No. 5,172,390 issued Dec. 15, 1992 and PCT application No. 92/07557 entitled "Pre-Aligned Diode Laser for External Cavity Operation" filed Sep. 9, 1992; each of which is incorporated herein in its entirety by reference.

BACKGROUND OF THE INVENTION

This invention relates generally to lasers and, more specifically, to semiconductor lasers operated in an external cavity.

A laser is a device which has the ability to produce monochromatic, coherent light through the stimulated emission of photons from atoms, molecules or ions of an active gain medium which have typically been excited from a ground state to a higher energy level by an input of energy. Such a device contains an optical cavity or resonator which is defined by highly reflecting surfaces which form a closed round trip path for light. The active gain medium is contained within the optical cavity.

If a population inversion is created by excitation of the active medium, the spontaneous emission of a photon from an excited atom, molecule or ion undergoing transition to a lower energy state can stimulate the emission of photons of substantially identical energy from other excited atoms, molecules or ions. As a consequence, the initial photon creates a cascade of photons between the reflecting surfaces of the optical cavity which are of substantially identical energy and exactly in phase. This multiplication effect causes light inside the cavity to undergo gain, which, along with the feedback provided by the resonator, constitutes a laser oscillator. A portion of this cascade of photons is then discharged out of the optical cavity, for example, by transmission through one or more of the reflecting surfaces of the cavity. These discharged photons constitute the laser output.

Excitation of the active medium of a laser can be accomplished by a variety of methods. However, the most common methods are optical pumping, use of an electrical discharge, and the passage of an electric current through the p-n junction of a semiconductor laser.

Semiconductor lasers contain a p-n junction which forms a diode, and this junction functions as the active medium of the laser. Such devices, which are also referred to as diode lasers, are typically constructed from materials such as gallium arsenide and aluminum gallium arsenide alloys. The efficiency of such lasers in converting electrical power to output radiation is relatively high and, for example, can be in excess of 40 percent.

In recent years, improvements in laser performance have resulted from the fabrication of so-called "superlattice" and quantum-well (QW) structures. A lattice is formed of alternate layers of thin (5–40 nm) epitaxial films of semiconductor material of different band gap to form a plurality of heterojunction interfaces. A thin film of narrow band gap material, e.g., GaAs, is sandwiched between thin films of wider band gap material, e.g., $Al_xGa_{(1-x)}As$ to form potential wells. Such wells restrict or limit carrier/electron movement to two dimensions. Such a multilayer is referred to as a two-dimensional quantum-well, or simply a quantum-well. In the example given, the electron motion is restricted in the direction perpendicular to the heterojunction interfaces, while the electrons are free to move in the other two directions.

Quantum-well lasers generally exhibit lower threshold than bulk crystal heterostructures. Devices are usually formed of multiple layers of quantum-wells and when the barrier thickness between quantum-wells is reduced, so that well wave functions couple, a "superlattice" is formed.

Generally, the materials of choice for superlattice and/or quantum-well structures are the Group III and V elements and, in particular, GaAs and Al alloys thereof. These materials are closely lattice matched, yet the difference in the band gaps of the GaAs versus the alloy $Al_xGa_{(1-x)}As$ can vary at room temperature from 0 eV to as much as 0.75 eV (as x increases from 0 to 1). The first property simplifies heterostructure fabrication, while the second property makes fabrication of quantum-wells possible.

SUMMARY OF THE INVENTION

As noted in U.S. Pat. No. 5,050,179, issued 17 Sep. 1991, numerous advantages accrue to semiconductor lasers in an external cavity as contrasted to solitary diode laser operation. In external cavity-controlled semiconductor lasers, a diode laser with opposed antireflective (AR) coated first and second facets is mounted between a pair of AR coated lenses and electrically pumped by providing a voltage across the p/n junction of the diode laser. The facets extend in a plane perpendicular to the plane of the diode gain region extending along the length of the diode laser. One of the lenses collects the laser radiation from the first facet and collimates it onto a frequency tuning element, such as a diffraction grating, mounted in the external cavity. The incident beam is dispersed by the grating and reflected collinear with the incident beam and re-imaged onto the first diode facet. Radiation from the second facet is collimated onto an output coupler formed by a dielectric coated, partially reflecting plane mirror.

Selection and tunability of the emission wavelength of the diode laser is achieved by varying the tilt of the diffraction grating to select an appropriate single frequency within the bandwidth of the diode laser to feed back energy to lock the diode laser at the selected frequency. This is in contrast to single diode laser operation which is amenable to reversible frequency control only by externally induced variation of band gap energy and refraction index (through changes in temperature or pressure for example) or by variation of injection current.

Stable, single-mode laser operation in an external cavity necessitates a high degree of thermal and mechanical stability in the cavity. Furthermore, the lens which collimates the laser radiation from the diode laser onto the diffraction grating must be accurately aligned with the facet to avoid mode instabilities. The linear alignment precision requirement is in the order of one wavelength. Alignment is a time-consuming, tedious procedure requiring expensive calibrating equipment. Of necessity, therefore, this alignment process is presently performed by the cavity manufacturer before the cavity is sold to the consumer.

The spectral range of the diffraction grating is in the order of 400 nm, whereas the spectral range of most diode lasers is only about 50 nm. Therefore, when output wavelengths are required beyond the range of a given diode, as a practical matter, it is usually necessary to purchase another external cavity package with a diode operating in the desired wavelength range to avoid the aforementioned tedious realignment.

In the aforesaid related PCT Application U.S. 92/07557, filed Sep. 9, 1992, diode lasers mounted in lens frame assemblies are provided in which a first facet of a diode laser is pre-aligned with a first of two lenses. The first lens collimates light onto a tuning element disposed at one end of an external cavity. The frames are insertable into an external cavity housing at another end. Each frame assembly is interchangeable with another, except that each diode laser within a given frame assembly is prealigned with a lens and covers a different portion of the wavelength range of, for example, 40-50 nm within the broad spectral range of the tuning element. Each frame assembly consists of a diode laser supported between a first and second lens. The frame assembly consists of a rigid walled member which extends from a planar support. Opposed sides of the member are provided with an opening with an axis which extends parallel to the support plane. The lenses are mounted in these openings with the diode laser disposed between the lenses.

Light from the tuning element is focused back on the first facet and the light is dispersed perpendicular to the plane of the gain region of the diode laser to feed back energy to tune the diode laser to a single frequency. In this manner, the full frequency range of the tuning element may be exploited in a quick, simple and reliable manner by substituting pre-aligned diode lasers covering portions of the range. In alternate embodiments, of the related PCT application several diode lasers are provided in each frame so that laser radiation may be obtained simultaneously at multiple wavelengths or to enable a plurality of frequency ranges to be quickly and accurately selected within a single cavity system.

Typically, the tuning element is mounted on a holder by means of set screws and suspended in two directions from a back plate by means of springs which allows the grating to be tilted about a transverse axis by rotation of the set screws which bear upon a bearing pad.

In accordance with the present invention, broad wavelength tuning is achieved in a tunable external cavity laser system by providing a plurality of surface emitting quantum well semiconductor laser chips adapted for movement into alignment between a common optical pump source and a tuning element in an external cavity. The pump source may comprise an electrical power supply for electrically pumping a diode laser or a diode laser array.

DETAILED DESCRIPTION OF THE DRAWINGS

Figure 1:
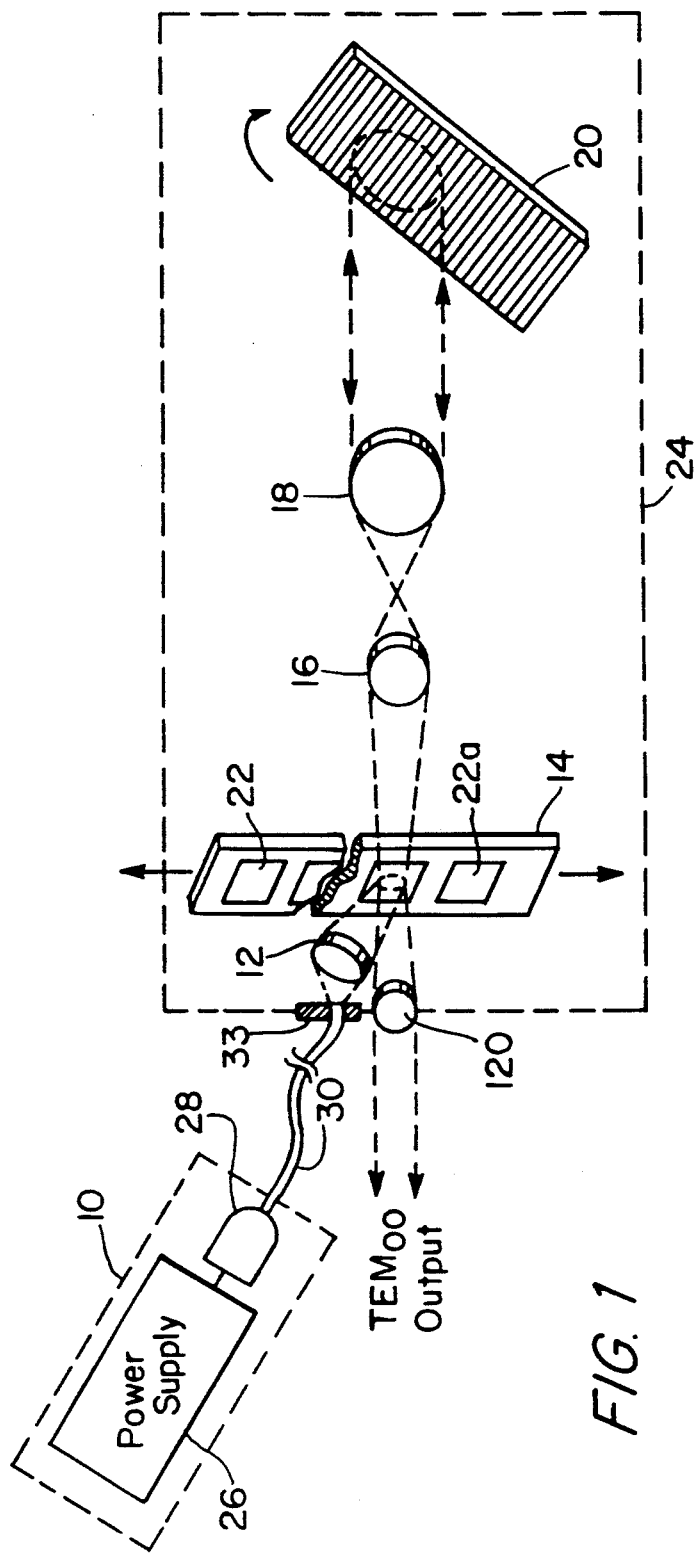
FIG. 1 is an isometric schematic drawing of a first embodiment of multichip optically pumped quantum well external cavity operated laser system of the invention.

Referring now to the drawings and FIGS. 1 and 2 in particular, the invention will now be described in detail in connection therewith.

A multi-element optically pumped external cavity QW semiconductor laser system is shown in FIG. 1 to comprise, in general, an optical pump source 10 coupled via fiber optics 30 to a connector 33 on housing 24. Lens 12 focuses circularly symmetric pumping light from fiber optic 30 onto a front facet 22(a) of one of a plurality of semiconductor QW laser chips 22. The chips 22 are mounted on a vertically translatable heat sink frame 14 disposed within housing 24. The pumping light causes stimulated emission of coherent laser light to occur within a gain or active region of the QW chip defined by the diameter of the pump light. Laser light from the rear facet 22(b) (FIG. 2) is collected by lens 16 and collimated by lens 18 onto a tuning element, such as, grating 20 pivotally mounted within housing 20. Dispersed light reflected by the grating 20 is directed by lens 18 and lens 16 back onto the rear facet 22b of chip 22 to feed back optical energy for further stimulated emission. The resultant $TEM_{00}$ output laser emission from front facet 22(a) is collected and collimated by a lens 120. Note: All the intracavity surfaces should be antireflection coated, including the surface of the quantum-well which is disposed within the optical resonator. Note also that, unlike conventional edge emitting diode lasers, a quantum-well structure is a surface emitting device, in that, the light emerges perpendicular to the quantum well layer surfaces.

The emission wavelength of the output beam is controlled by varying the tilt of grating 20 to select an appropriate single frequency within the bandwidth of the QW laser chip 22 to feed back energy to lock the QW laser chip 22 at the selected frequency. Note that other tuning elements such as tilted etalons, electro-optically (E/O) tuned double etalons, mechanical or E/O tuned LYOT filters may be substituted from the diffraction grating 20.

Figure 2:
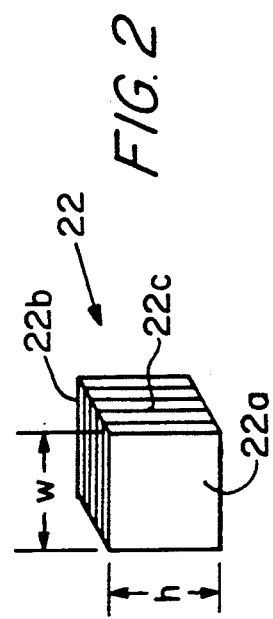
FIG. 2 is a schematic perspective view of a single QW chip 22 of FIG. 1.

Details of the QW chips are shown in FIG. 2. A QW chip 22 is comprised of a plurality of ultrathin alternating heterostructure layers 22c of less than about ten nanometers in thickness. Typically the quantum wells are comprised of alternate layers of GaAs and $Al_x Ga_{1-x}As$ formed by molecular beam epitaxy (MBE).

For example, the QW laser 22 may comprise layers of GaAs active wells and AlGaAs barriers. Other III-V elements and alloys thereof, such as In and Sb, are also contemplated for formation of quantum well lasers in accordance with the invention.

Source 10 preferably consists of a laser diode or an array of laser diodes 28 which are electrically pumped by electrical power supply 26.

Frame 14 also serves as a heat sink for dissipating thermal energy generated in the QW lasers 22 and may be comprised of sapphire or other suitable heat conductive medium.

Note that the optical power produced by a semiconductor laser is usually limited by catastrophic degradation of the surface of the semiconductor, usually in the range of $10^6$ w/cm². In the present invention a large area can be pumped; whereas for a laser diode only the edge emitting p/n juncture surface is active. Therefore the present system is capable of generating much higher power i.e., at least 50 times more than a conventional diode laser. Furthermore, the larger pump area means that alignment of the chip within the beam is not as critical as for an edge emitting diode laser.

Figure 3:
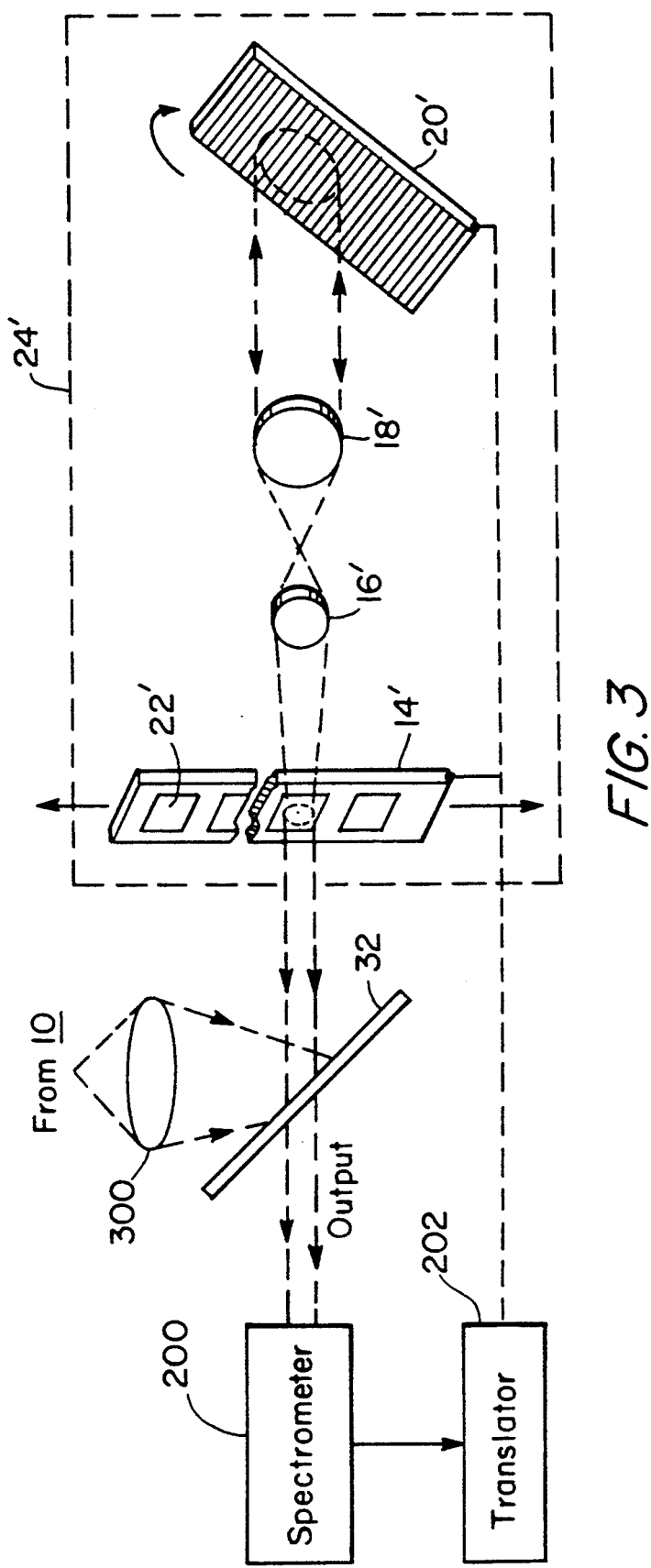
FIG. 3 is a schematic sectional view of an alternate embodiment of the invention.

In the alternate embodiment of FIG. 3 like parts retain the same number with a prime suffix. In FIG. 3 the system is the same as previously described except that lens 12 has been replaced by a dichroic mirror 32 which reflects light, from pump source 10 and collimated by lens 300, onto front facets of QW chips 22'. Each chip 22' as in FIG. 1 may be fabricated to cover a different frequency spectrum within the overall range of tuning element 20'. As in FIG. 1 all the optics are pre-calibrated, aligned, and fixed in place and the frame is moved with respect to the optics in order to bring different QW chips 22 into focus.

As shown in FIG. 3, the output beam from mirror 32 may be used as a high power tunable frequency source for a spectrometer 200 or for other diverse medical applications, such as laser surgery etc. A microprocessor in spectrometer 200 may be used to control servomechanical translator 202 for separate or coordinate movement of frame 22' and tuning element 20'.

Figure 6:
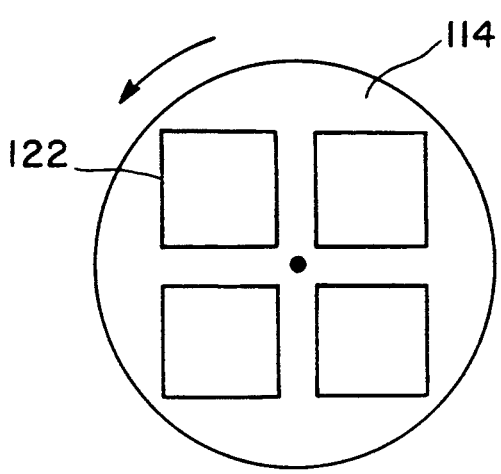
FIG. 6 is a front view of an alternate embodiment of a frame assembly of the invention.

Alternatively, as shown in FIG. 6 the frame assembly 114 may be mounted for circular movement in the housing such that each chip 122 may be rapidly aligned with the pump beam.

For high power operation, an optically pumped multi-element semiconductor disc system may be used to amplify the output of the master oscillator as described in U.S. Pat. No. 5,131,002. The chips can have one or more quantum wells. For longitudinal pumping, the quantum well layers are formed orthogonal to the direction of the external cavity laser beam.

Figure 4:
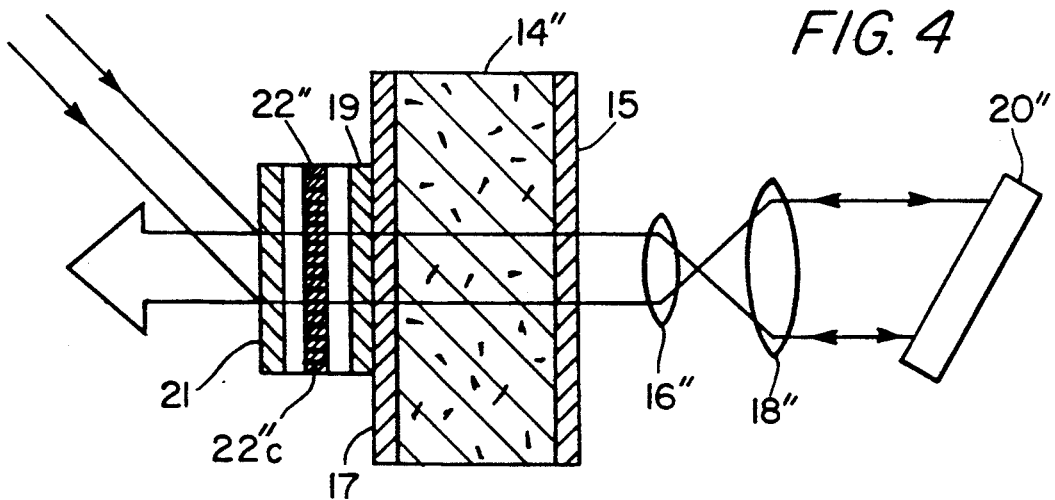
FIG. 4 is a schematic drawing of another alternate embodiment of the invention.

As shown schematically in FIG. 4 the quantum well chips 22" may be transversely pumped by the pump beam instead of longitudinally pumped as in FIGS. 1 or 2. In this embodiment the QW layers 22"c extend parallel to the laser beam between a dichroic output coupler layer 21 and an anti-reflective (AR) coating 19. The QW chip is mounted on an optically transparent heat sink 14", formed for example of a body of sapphire coated on opposite sides with AR material. The output frequency of the chips 22' is controlled as in previous embodiments by feedback of optical energy from tuning element 20" via lenses 16" and 18".

Multiple chips may be mounted on a single heat sink which is subsequently moved by a mechanical motion in either a linear or circular way. This has the disadvantage over the longitudinally pumped systems in that the mode size in the gain region is not necessarily symmetric and the alignment of the external cavity is more difficult.

Figure 5:
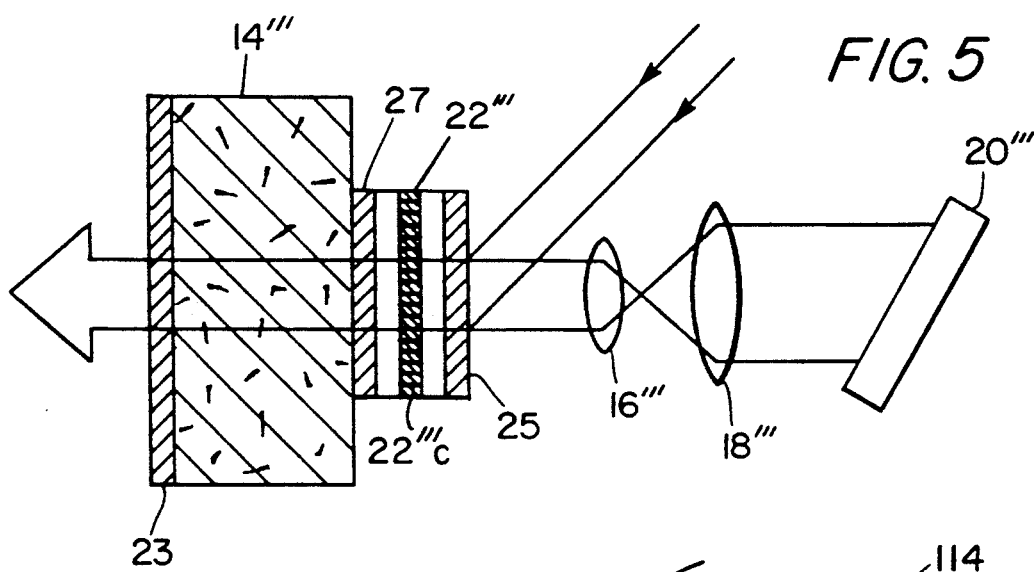
FIG. 5 is a schematic drawing of yet another alternate embodiment.

The FIG. 5 embodiment is similar to the FIG. 4 embodiment except that the heat sink 14''' is mounted on the output beam side of the system and the pump beam is focused on the rear side of the QW laser 22''' formed between a rear AR film 25 and a front dichroic mirror surface 27.

Numerous advantages accrue from the system of the invention.

No electrical inputs are required into the chips and no metalization is required for electrical contacts.

All power is supplied by a single pump diode laser or array powered by a master power supply.

No pn junctions need to be formed in the QW wafer and therefore much less free carrier and/or dopant absorption occurs.

Generally only two or three pump wavelengths will be required to effectively pump all the wavelengths between 670 nm and beyond 1700 nm and diode lasers are presently available from manufacturers at wavelengths less than 670 nm.

The pump diode laser or laser array and its heat load are separately located in a remote primary power supply and coupled via fiber optics to the QW laser thus minimizing heat dissipation problems.

Circularly symmetric $TEM_{00}$ beam output may be obtained, when the chip is longitudinally pumped.

All QW chips with different wavelengths may be mounted on the same heat sink and may use a common external cavity.

Mode diameter (on the order of $\sqrt{\lambda l}$, where $l$=cavity length) in the QW chip of up to a few hundred microns is possibly which means that a conventional mode design may be employed for greatly improved stability over that for an external cavity using a conventional electrically pumped diode laser.

Cavity alignment is substantially insensitive to motions which alter the semiconductor chip position in the cavity because the chip is larger than the beam width and the active area of the chip pumped by the pump beam is much larger (i.e. about 300 microns in diameter) than that used in a conventional edge emitting diode which has a gain region of only about 3 microns width and 700 micron length. This means that the housing may be of less rigid construction thereby reducing the packaging costs.

If the QW laser is longitudinally pumped, the shorter length of gain region in the longitudinally pumped device means less thermal index distortion than for a conventional diode laser. Also, the thermal gradient is radially symmetric.

Mode-locked or pulsed operation may be obtained by directly modulating the pump diode laser or array.

Equivalents

Those skilled in the art will recognize, or be able to ascertain, using no more than routine experimentation, many equivalents to specific embodiments of the invention described herein.

These and all other equivalents are intended to be encompassed by the following claims.

I claim:

1. A laser system comprising:
   a) a housing;
   b) a frame formed of a thermally conductive member and adapted for movement within said housing;
   c) a remote source of a beam of optical pump light; and
   d) a plurality of quantum well structures adapted to be optically pumped by said beam and mounted on said member for alignment with said beam.

2. The system of claim 1 wherein the frame is rotationally moveable such that selected structures are moved into the path of said beam.

3. The system of claim 1 wherein the frame is linearly moveable such that selected structures are moved into the path of said beam.

4. The system of claim 1 wherein the quantum well structure is formed of alternate layers of III-V materials or alloys thereof.

5. The system of claim 4 wherein the III-V material comprises material from the group comprising Al, Ga or As.

6. The system of claim 1 wherein the quantum well structures are adapted to be selectively disposed between said beam and a tuning element.

7. A system for optically pumping quantum well structures comprising:
   a) quantum well structures mounted on a frame assembly for insertion into an external cavity housing;
   b) a pump source for optically pumping said quantum well structures with light;
   c) optics for coupling light from said source to selected structures to produce stimulated light emission therefrom; and
   d) a tuning element disposed within said housing for receiving light emission from said selected structures for causing the frequency of said light emission to become substantially single frequency light within the frequency range of the selected structure.

8. The system of claim 7 wherein the tuning element is a diffraction grating.

9. The system of claim 7 wherein a lens is provided in the housing for focusing the pump source light on a facet of the quantum well lasers.

10. The system of claim 7 wherein the frame assembly is rotatable past the light.

11. The system of claim 7 wherein the frame assembly is linearly translatable past the light.

12. An external cavity system for a quantum well laser structures, comprising:
   a) a plurality of quantum well laser structures mounted on a frame assembly for insertion into a housing;
   b) a source of pump light for optically pumping the quantum well laser structures with a pump beam;
   c) means for moving the frame assembly with respect to the pump beam to cause selected quantum well laser structures to be pumped by said beam; and
   d) a tuning element disposed in the housing for reflecting laser light emitted from said selected quantum well laser structure back upon a facet thereof from said tuning element thereby causing the selected quantum well laser to emit substantially single frequency light.

13. The system of claim 12 in which the structure is formed of layers of quantum wells is longitudinally pumped in a direction orthogonal to the layers.

14. The system of claim 12 in which the structure is formed of quantum well layers and is transversely pumped in a direction parallel to the layers.

15. The system of claim 12 wherein the quantum well laser is formed of III-V material.

16. An external cavity system for a quantum well laser device, comprising:
   a) a plurality of quantum well structures affixed to a frame mounted in a housing;
   b) a pump source for generating a pump beam capable of stimulating light emission from a first facet of said quantum well structures;
   c) scanning means for causing relative movement between said pump beam and said quantum well structures to selectively direct said beam upon a respective second facet opposite said first facet of said quantum well structures; and
   an external cavity in which a tuning element is disposed adjacent said quantum well structure and wherein light emitted from the first facet of a respective quantum well structure is dispersed by said tuning element and the dispersed light is reflected back upon said first facet; thereby causing the quantum well laser to emit substantially single frequency light within the frequency range of the dispersed light from the grating.

17. The system of claim 16 wherein the quantum well structure is formed of layers of III-V material.

18. The system of claim 17 in which the quantum well structure is pumped in a direction traverse the layers.

19. The system of claim 16 in which the quantum well structure is pumped in a direction parallel to the layers.

20. A method of selectively generating single frequency $TEM_{00}$ light waves across a broad frequency spectrum comprising the steps of:
   a) affixing a series of quantum well chips to a frame;
   b) mounting the frame in the interior of an external cavity housing;
   c) optically pumping a selected chip with a pump beam to stimulate $TEM_{00}$ light emission from a first facet thereof; and
   d) dispersing the light emission and feeding back a portion of the dispersed light at said single frequency to said first facet whereby $TEM_{00}$ light at the single frequency is emitted from a second facet of said selected chip.

21. The method of claim 20 wherein the chip is selected by moving the frame with respect to the pump beam such that the selected chip is brought into alignment therewith.

22. The method of claim 20 wherein optical pumping is supplied by a fiber optic coupled to a remote electrically pumped laser diode.

23. The method of claim 22 wherein the pump beam is circularly symmetric.

24. The method of claim 20 wherein a dispersive grating is used to disperse the light.

* * * * *